(12) United States Patent
Huang et al.

(10) Patent No.: US 12,131,111 B2
(45) Date of Patent: Oct. 29, 2024

(54) METHOD, APPARATUS AND DEVICE FOR MEASURING SEMICONDUCTOR STRUCTURE

(71) Applicant: CHANGXIN MEMORY TECHNOLOGIES, INC., Anhui (CN)

(72) Inventors: Xin Huang, Anhui (CN); Shih-Shin Wang, Anhui (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 499 days.

(21) Appl. No.: 17/488,900

(22) Filed: Sep. 29, 2021

(65) Prior Publication Data

US 2022/0277129 A1    Sep. 1, 2022

Related U.S. Application Data

(63) Continuation of application No. PCT/CN2021/102276, filed on Jun. 25, 2021.

(30) Foreign Application Priority Data

Mar. 1, 2021    (CN) .......................... 202110224162.3

(51) Int. Cl.
    *G06F 30/398*    (2020.01)
(52) U.S. Cl.
    CPC ................................. *G06F 30/398* (2020.01)
(58) Field of Classification Search
    CPC .................................................... G06F 30/398
    See application file for complete search history.

(56) References Cited

U.S. PATENT DOCUMENTS 9,412,673 B2    8/2016 Kim et al.
9,915,522 B1 *  3/2018 Jiang ................... G03F 7/70616
(Continued)

FOREIGN PATENT DOCUMENTS

CN    102183212 A    9/2011
CN    102918464 A    2/2013
(Continued)

*Primary Examiner* — Nghia M Doan
(74) *Attorney, Agent, or Firm* — Syncoda LLC; Feng Ma (57) ABSTRACT

Embodiments of this application provide a method, an apparatus and a device for measuring a semiconductor structure. Before measurement of a to-be-measured semiconductor structure, a reference semiconductor structure corresponding to the to-be-measured semiconductor structure is set, and a first simulation model corresponding to the to-be-measured semiconductor structure and a second simulation model corresponding to the reference semiconductor structure are established, some structure parameters of the to-be-measured semiconductor structure have parameter values different from those of corresponding structure parameters of the reference semiconductor structure. During measurement of the to-be-measured semiconductor structure, both the to-be-measured semiconductor structure and the reference semiconductor structure are simultaneously measured by using an OCD measurement technology, to find structure parameters that can satisfy both the first simulation model and the second simulation model, and parameter value of each structure parameter finally determined for the first simulation model is used as structure parameter of the to-be-measured semiconductor structure.

16 Claims, 2 Drawing Sheets

(56) References Cited

U.S. PATENT DOCUMENTS

| | | | |
|---|---|---|---|
| 9,977,340 B2 | 5/2018 | Aben et al. | |
| 10,325,004 B1 * | 6/2019 | Dziura | G01N 21/95607 |
| 2006/0146347 A1 | 7/2006 | Smith et al. | |
| 2008/0241974 A1 * | 10/2008 | Bischoff | H01L 22/12 |
| | | | 257/E21.53 |
| 2016/0341670 A1 | 11/2016 | Vagos | |
| 2020/0301268 A1 | 9/2020 | Bonam et al. | |

FOREIGN PATENT DOCUMENTS

| | | |
|---|---|---|
| CN | 105444666 A | 3/2016 |
| CN | 107345788 A | 11/2017 |
| CN | 110083017 A | 8/2019 |
| CN | 113035735 A | 6/2021 |
| TW | I631314 B | 8/2018 |

* cited by examiner

To-be-measured semiconductor structure | Reference semiconductor structure

METHOD, APPARATUS AND DEVICE FOR MEASURING SEMICONDUCTOR STRUCTURE

CROSS-REFERENCE TO RELATED APPLICATIONS

This present application is a continuation application of International Patent Application No. PCT/CN2021/102276, filed on Jun. 25, 2021, entitled "METHOD, APPARATUS AND DEVICE FOR MEASURING SEMICONDUCTOR STRUCTURE", which claims the priority to Chinese Patent Application No. 202110224162.3, titled "METHOD, APPARATUS AND DEVICE FOR MEASURING SEMICONDUCTOR STRUCTURE", filed with China National Intellectual Property Administration (CNIPA) on Mar. 1, 2021. International Patent Application No. PCT/CN2021/102276 and Chinese Patent Application No. 202110224162.3 are incorporated herein by reference in their entireties.

TECHNICAL FIELD

Embodiments of this application relate to the technical field of semiconductors, and in particular, to a method, an apparatus and a device for measuring a semiconductor structure.

BACKGROUND

With the development of the semiconductor industry, line widths of integrated circuits are continually decreased, and the structure design of integrated circuit devices becomes increasingly complex. In this case, a fully functional circuit and a high-speed operating device can be obtained only through strict process control.

As an important measurement technology, an optical critical dimension (OCD) measurement technology plays an important role in advanced process control in a current semiconductor manufacturing process. A basic operating principle of the OCD measurement technology can be described as follows: (1) A theoretical spectrum corresponding to morphology of a to-be-measured semiconductor structure is obtained by fitting based on a model. (2) A measured spectrum of the to-be-measured semiconductor structure is obtained by an OCD measurement device. (3) A parameter of the model is adjusted to make the theoretical spectrum obtained by fitting successfully match the measured spectrum, and a structure parameter of the to-be-measured semiconductor structure can be obtained based on a final parameter of the model.

However, with the development of semiconductor technologies, materials used for semiconductor structures that need to be measured become increasingly complex, and process control imposes an increasingly high requirement for the measurement accuracy. Therefore, how to improve the measurement accuracy of a semiconductor structure is a technical problem that urgently needs to be resolved currently.

SUMMARY

According to a first aspect, an embodiment of this application provides a method for measuring a semiconductor structure, where the method includes:

establishing a first simulation model corresponding to a to-be-measured semiconductor structure and a second simulation model corresponding to a reference semiconductor structure, where at least one first structure parameter of the to-be-measured semiconductor structure has a same parameter value as a corresponding first structure parameter of the reference semiconductor structure, and at least one second structure parameter of the to-be-measured semiconductor structure has a parameter value different from a parameter value of a corresponding second structure parameter of the reference semiconductor structure;

measuring spectra of both the to-be-measured semiconductor structure and the reference semiconductor structure to obtain a first standard spectrum and a second standard spectrum; and adjusting first structure parameters and second structure parameters of the first simulation model and the second simulation model, and when each of the adjusted first structure parameters of the first simulation model and the second simulation model is the same, and a spectrum obtained by fitting based on the adjusted first simulation model and a spectrum obtained by fitting based on the adjusted second simulation model successfully match the first standard spectrum and the second standard spectrum, respectively, determining parameter value of each structure parameter of the adjusted first simulation model as parameter value of each structure parameter of the to-be-measured semiconductor structure.

According to a second aspect, an embodiment of this application provides an apparatus for measuring a semiconductor structure, where the apparatus includes:

a model establishment module, configured to establish a first simulation model corresponding to a to-be-measured semiconductor structure and a second simulation model corresponding to a reference semiconductor structure, where at least one first structure parameter of the to-be-measured semiconductor structure has a same parameter value as a corresponding first structure parameter of the reference semiconductor structure, and at least one second structure parameter of the to-be-measured semiconductor structure has a parameter value different from a parameter value of a corresponding second structure parameter of the reference semiconductor structure;

a measurement module, configured to measure spectra of both the to-be-measured semiconductor structure and the reference semiconductor structure to obtain a first standard spectrum and a second standard spectrum; and an adjustment module, configured to adjust first structure parameters and second structure parameters of the first simulation model and the second simulation model, and when each of the adjusted first structure parameters of the first simulation model and the second simulation model is the same, and a spectrum obtained by fitting based on the adjusted first simulation model and a spectrum obtained by fitting based on the adjusted second simulation model successfully match the first standard spectrum and the second standard spectrum, respectively, determine parameter value of each structure parameter of the adjusted first simulation model as parameter value of each structure parameter of the to-be-measured semiconductor structure.

According to a third aspect, an embodiment of this application provides an electronic device, including: at least one processor and a memory;

the memory stores computer-executable instructions; and the at least one processor executes the computer-executable instructions stored in the memory, so that the at least one processor implements the method for measuring the semiconductor structure according to the first aspect.

According to a fourth aspect, an embodiment of this application provides a computer-readable storage medium, the computer-readable storage medium stores instructions, and when the instructions are run on a computer, the computer is enabled to implement the method for measuring the semiconductor structure according to the first aspect.

BRIEF DESCRIPTION OF THE DRAWINGS

To describe the technical solutions in the embodiments of this application or in the prior art more clearly, the following briefly describes the accompanying drawings required for describing the embodiments of this application or the prior art. Apparently, the accompanying drawings in the following description show some embodiments of this application, and persons of ordinary skill in the art may still derive other drawings from these accompanying drawings without creative efforts.

DETAILED DESCRIPTION

To make the objectives, technical solutions, and advantages of the embodiments of this application clearer, the following clearly and completely describes the technical solutions in the embodiments of this application with reference to the accompanying drawings in the embodiments of this application. Apparently, the described embodiments are some rather than all of the embodiments of this application. All other embodiments obtained by persons of ordinary skill in the art based on the embodiments in this application without creative efforts shall fall within the protection scope of this application.

With the development of the semiconductor integrated circuit manufacturing industry, critical dimensions of semiconductor structures in a semiconductor manufacturing process become increasingly small, and more device structure parameters need to be controlled. In this case, conventional optical imaging analysis methods can no longer implement measurement of the critical dimensions in the process. Therefore, new imaging technologies are continuously applied to morphology measurement in a semiconductor process, such as scanning electron microscopy and atomic force microscopy, and can implement high-precision measurement of critical dimensions and groove depth dimensions. However, the morphology measurement process is complex, is destructive to a to-be-measured sample, and cannot implement online measurement. An optical thin-film measurement instrument can measure thin-film thicknesses of multiple layers of different materials in a non-patterned area, but cannot measure a patterned area, for example, a periodic grating structure. An OCD measurement technology has many advantages such as non-contact, non-destructive, simultaneous measurement of multiple process characteristics, and online measurement of the process. Therefore, the OCD measurement technology is increasingly widely used in the semiconductor manufacturing industry.

The OCD measurement technology is an important measurement technology. A basic operating principle of the OCD measurement technology is as follows: A theoretical spectrum corresponding to morphology of a to-be-measured sample is obtained by fitting based on a model. A measured spectrum of the to-be-measured sample is obtained by an OCD measurement device. A parameter of the model is adjusted to make the theoretical spectrum obtained by fitting successfully match the measured spectrum, and a structure parameter of the to-be-measured sample can be obtained based on an adjusted parameter of the model.

The theoretical spectrum corresponding to the morphology of the to-be-measured sample is obtained by fitting based on the model. To be specific, a theoretical spectrum of the to-be-measured sample described by a model is calculated based on the model of a grating. In an example, a representative calculation method is a rigorous coupled-wave analysis theory (RCWA) method. A theoretical diffraction spectrums (x, λ) of the to-be-measured sample may be calculated by using a related theory (such as RCWA) and establishing a model. Usually, a parameter vector $x=(x0, x1, \ldots, xL-1)^T, xj$, where $j=0, \ldots, L-1$, and it can be used to represent all structure parameters of a to-be-measured structure. For example, assuming that to-be-measured structure parameters of the to-be-measured sample are a side wall angle (SWA), a height (HT), and a critical dimension (CD), a parameter vector x=(CD, SWA, HT) may be used to describe a model of the to-be-measured structure.

A process of obtaining the measured spectrum of the to-be-measured sample by the OCD measurement device can be described as follows: light from a light source of a diffraction spectrometer is incident on a periodic structure area of the to-be-measured sample through a polarizer, and after the light is diffracted by the to-be-measured sample, diffracted light at all orders includes information about a structure, a material, and the like of the to-be-measured sample. Zero-order diffracted light is usually received by a diffraction detector through a polarization analyzer. A diffractometer processes a received diffracted light signal to obtain a measured spectrum including the information about the to-be-measured sample.

The adjusting a parameter of the model to make the theoretical spectrum obtained by fitting successfully match the measured spectrum, and obtaining a structure parameter of the to-be-measured sample based on an adjusted parameter of the model includes: in a spectrum matching process, first establishing a structure model of a periodic structure of the to-be-measured sample based on information about a manufacturing process for the to-be-measured sample, where the structure model is determined by the to-be-measured structure parameter; and calculating, according to a light diffraction principle of the periodic structure, a theoretical diffraction spectrum of the structure model determined by a group of specific structure parameters. Different theoretical spectra can be obtained by adjusting the parameters of the structure model. The spectrum matching process is to find a group of to-be-measured structure parameters, to obtain optimum matching between a theoretical spectrum of the to-be-measured sample that has the parameter morphology and a measured spectrum. In this way, morphology determined by this group of parameters may be used to represent actual morphology of the to-be-measured sample, so as to implement measurement of a line width and other structure parameters of the to-be-measured sample.

Further, as a dimension of an integrated circuit is increasingly decreased, critical dimensions of components that form the integrated circuit, such as widths of an electrical device and an interconnect line, are also increasingly decreased. For example, in memory circuits or devices such as a dynamic random access memory (DRAM) and a static random access memory (SRAM), there is a significant tendency to reduce a critical dimension. For example, the DRAM typically includes millions of same circuit elements referred to as memory cells. In a most common form of the DRAM, the memory cell typically includes two electrical devices: a storage capacitor and an access field-effect transistor. Each memory cell is an addressable location that can store one-bit (binary number) data. The bit may be written into the cell by using a transistor, and read from charges that are on the storage electrode and that is sensed on a reference electrode side. By reducing dimensions of a component, an electrical device, and a contact wire, a dimension of a memory incorporating these features can be reduced. In addition, a storage capacity of the memory can be increased by installing more memory cells in the memory.

Continuous reduction of a feature dimension imposes a higher requirement on a technology for forming component features. For example, a photolithography technology is usually used to pattern features on a substrate such as wires. A concept of a spacing may be used to describe dimensions of these features. The spacing is defined as a distance between same points in two adjacent features. These features are typically limited by space between adjacent features, the space is typically filled with a material such as an insulator. The spacing can be regarded as a sum of a width of a feature and a width of space that separates the feature from an adjacent feature. However, each lithography technology is corresponding to a minimum spacing. In case of the minimum spacing, a particular lithography technology cannot reliably form features. Therefore, the minimum spacing involved in the lithography technology possibly limits reduction of a feature dimension.

In a semiconductor structure manufacturing process, a material used for a deposited layer may be oxide or nitride. Because both oxide and nitride are highly transmissive materials, when OCD measurement is used for optical measurement, these materials are less sensitive to light, blurring of a critical dimension boundary of a semiconductor structure, and affecting the accuracy of an OCD measurement result.

To resolve the above technical problems, an embodiment of this application provides a method for measuring a semiconductor structure. A reference semiconductor structure corresponding to a to-be-measured semiconductor structure is first set, and a first simulation model corresponding to the to-be-measured semiconductor structure and a second simulation model corresponding to the reference semiconductor structure are established. During measurement of the to-be-measured semiconductor structure, both the to-be-measured semiconductor structure and the reference semiconductor structure are simultaneously measured by using an OCD measurement technology, to find structure parameters that can satisfy both the first simulation model and the second simulation model, and parameter value of each structure parameter finally determined for the first simulation model is used as structure parameter of the to-be-measured semiconductor structure. In this way, an error of a measurement result of the to-be-measured semiconductor structure can be effectively reduced, and the measurement accuracy of the to-be-measured semiconductor structure can be improved. For details, refer to content described in the following embodiments.

Figure 1:
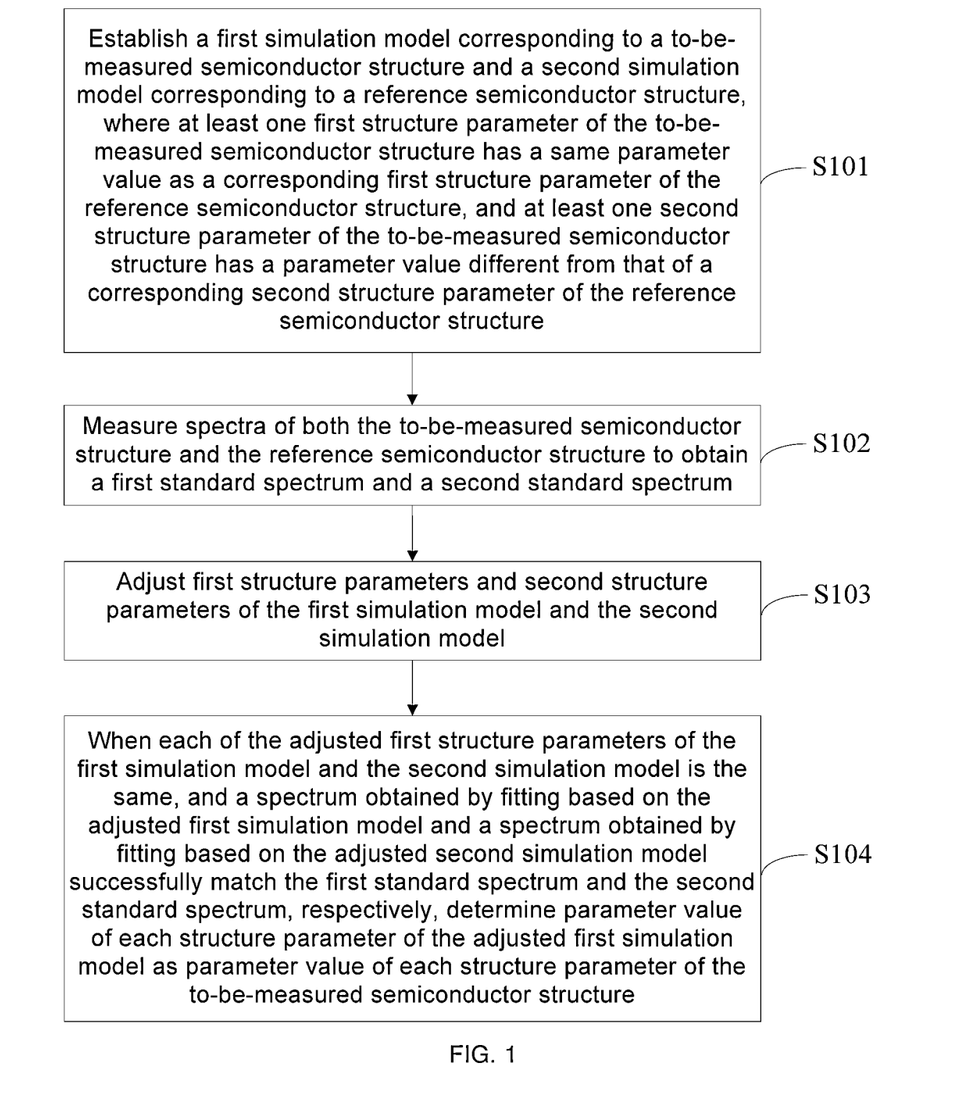
FIG. 1 is a schematic flowchart of a method for measuring a semiconductor structure according to an embodiment of this application.

Referring to FIG. 1, FIG. 1 is a schematic flowchart of a method for measuring a semiconductor structure according to an embodiment of this application. In a feasible implementation, the method for measuring a semiconductor structure includes:

S101. Establish a first simulation model corresponding to a to-be-measured semiconductor structure and a second simulation model corresponding to a reference semiconductor structure.

At least one first structure parameter of the to-be-measured semiconductor structure has a same parameter value as a corresponding first structure parameter of the reference semiconductor structure, and at least one second structure parameter of the to-be-measured semiconductor structure has a parameter value different from that of a corresponding second structure parameter of the reference semiconductor structure.

For example, assuming that there are three structure parameters, that is, a SWA, a HT, and a CD, for both the to-be-measured semiconductor structure and the reference semiconductor structure, there may be the following cases:

One structure parameter (which may be any one of the CD, the SWA, and the HT) of the to-be-measured semiconductor structure is the same as a corresponding structure parameter of the reference semiconductor structure, but the remaining two structure parameters of the to-be-measured semiconductor structure are respectively different from two corresponding structure parameters of the reference semiconductor structure.

Two structure parameters (which may be any two of the CD, the SWA, and the HT) of the to-be-measured semiconductor structure are the same as two corresponding structure parameters of the reference semiconductor structure, but the remaining structure parameter of the to-be-measured semiconductor structure is different from a corresponding structure parameter of the reference semiconductor structure.

In other words, in this embodiment of this application, during setting of the reference semiconductor structure corresponding to the to-be-measured semiconductor structure, a controlled variable method may be used to change some structure parameters of the reference semiconductor structure, to make the structure parameters of the reference semiconductor structure different from structure parameters of a corresponding same type in the to-be-measured semiconductor structure, and make the remaining structure parameters of the reference semiconductor structure all kept the same as corresponding structure parameters of the to-be-measured semiconductor structure.

S102. Measure spectra corresponding to both the to-be-measured semiconductor structure and the reference semiconductor structure to obtain a first standard spectrum and a second standard spectrum.

In a feasible implementation manner, an OCD measurement device may be used to measure the spectra of both the to-be-measured semiconductor structure and the reference semiconductor structure.

It can be understood that there is no sequence relationship between step S101 and step S102. In other words, in an actual measurement process, step S101 may be conducted before step S102, step S102 may be conducted before step S101, or step S101 and step S102 may be conducted at the same time. This is not limited in this embodiment of this application.

S103. Adjust first structure parameters and second structure parameters of the first simulation model and the second simulation model.

In this embodiment of this application, a preset relationship is always kept between the first structure parameters of the first simulation model and the second simulation model before and after adjustment. Optionally, the preset relationship may be an equality relationship. The second structure parameters of the first simulation model and the second simulation model may be adjusted according to actual structures of the first simulation model and the second simulation model.

In a feasible implementation, the first structure parameters and the second structure parameters of the first simulation model and the second simulation model may be adjusted simultaneously, and a multi-targeting calculation method may be used to match a first spectrum obtained by fitting based on the adjusted first simulation model with the spectrum corresponding to the to-be-measured semiconductor structure, and match a second spectrum obtained by fitting based on the adjusted second simulation model with the spectrum corresponding to the reference semiconductor structure.

In another feasible implementation, the first structure parameter and the second structure parameter of each of the first simulation model and the second simulation model may be divided into multiple groups; and based on the groups obtained through division, structure parameters in each of the groups of the first simulation model and the second simulation model may be adjusted in batches, matching a first spectrum obtained by fitting based on the adjusted first simulation model with the first standard spectrum is conducted, and matching a second spectrum obtained by fitting based on the adjusted second simulation model with the second standard spectrum is conducted.

Optionally, the foregoing spectrum matching process can be implemented based on the rigorous coupled-wave theory.

It can be understood that, types of first structure parameters of the to-be-measured semiconductor structure and the reference semiconductor structure are the same as types of the first structure parameters of the first simulation model and the second simulation model, and types of second structure parameters of the to-be-measured semiconductor structure and the reference semiconductor structure are the same as types of the second structure parameters of the first simulation model and the second simulation model.

For example, assuming that the first structure parameters of the to-be-measured semiconductor structure and the reference semiconductor structure are CDs, the types of the first structure parameters of the first simulation model and the second simulation model are also CDs; and assuming that the second structure parameters of the to-be-measured semiconductor structure and the reference semiconductor structure are CDs, the types of the second structure parameters of the first simulation model and the second simulation model are also CDs.

S104. When each of the adjusted first structure parameters of the first simulation model and the second simulation model are the same, and a spectrum obtained by fitting based on the adjusted first simulation model and a spectrum obtained by fitting based on the adjusted second simulation model successfully match the first standard spectrum and the second standard spectrum, respectively, determine parameter value of each structure parameter of the adjusted first simulation model as parameter value of each structure parameter of the to-be-measured semiconductor structure.

In this embodiment of this application, assuming that one first structure parameter of the to-be-measured semiconductor structure has a same parameter value as a corresponding first structure parameter of the reference semiconductor structure, if the first structure parameters of the first simulation model and the second simulation model are adjusted to a parameter value at the same time, not only a first spectrum obtained by fitting based on the adjusted first simulation model successfully matches the first standard spectrum corresponding to the to-be-measured semiconductor structure, but also a second spectrum obtained by fitting based on the adjusted second simulation model successfully matches the second standard spectrum corresponding to the reference semiconductor structure. In this case, the parameter value may be determined as a parameter value of the first structure parameter of the to-be-measured semiconductor structure. The parameter values of all structure parameters, including an adjusted first structure parameter and an adjusted second structure parameter, of the finally adjusted first simulation model, may be determined as the parameter values of the structure parameters of the to-be-measured semiconductor structure.

In addition, parameter values of all structure parameters, including the first structure parameter and the second structure parameter, of the finally adjusted second simulation model, may be determined as parameter values of structure parameters of the reference semiconductor structure.

According to the method for measuring a semiconductor structure provided in this embodiment of this application, the reference semiconductor structure corresponding to the to-be-measured semiconductor structure is preset, and the first simulation model corresponding to the to-be-measured semiconductor structure and the second simulation model corresponding to the reference semiconductor structure are established, where some structure parameters of the to-be-measured semiconductor structure have parameter values different from those of corresponding structure parameters of the reference semiconductor structure. During measurement of the to-be-measured semiconductor structure, both the to-be-measured semiconductor structure and the reference semiconductor structure are simultaneously measured by using an OCD measurement technology, to find structure parameters that can satisfy both the first simulation model and the second simulation model, and the parameter value of each structure parameter finally determined for the first simulation model is used as the structure parameter of the to-be-measured semiconductor structure. In this way, an error of a measurement result of the to-be-measured semiconductor structure can be effectively reduced, and the measurement accuracy of the to-be-measured semiconductor structure can be improved.

Based on the content described in the foregoing embodiment, in some existing implementations, the OCD measurement needs to be directly conducted in a component area, and the accuracy of a measurement result is easily affected by a bottom-layer structure of a semiconductor structure.

To reduce the impact of the bottom-layer structure of the semiconductor structure on the OCD measurement result, in a feasible implementation of this application, OCD measurement areas may be set in scribe lines corresponding to the to-be-measured semiconductor structure and the reference semiconductor structure. After the to-be-measured semiconductor structure and the reference semiconductor structure are etched to form periodic grating structures, both a spectrum corresponding to the periodic grating structure in the to-be-measured semiconductor structure and a spectrum corresponding to the periodic grating structure in the reference semiconductor structure are measured.

Figure 2:
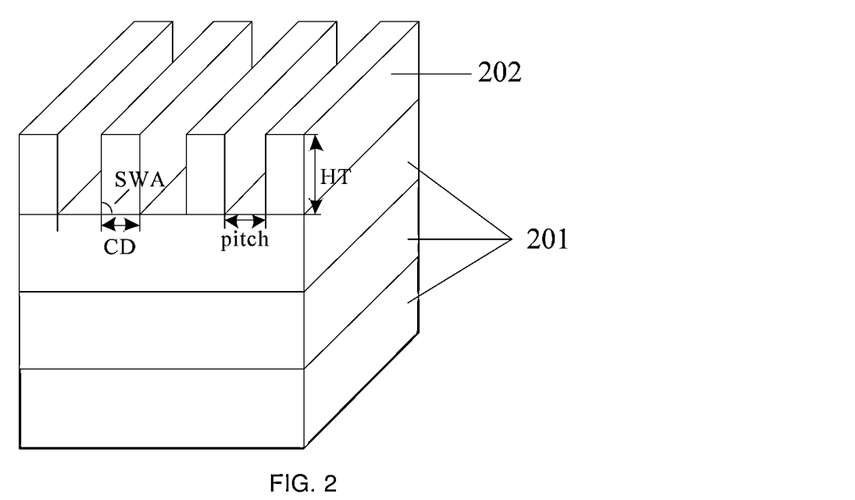
FIG. 2 is a schematic structural diagram of a to-be-measured semiconductor structure according to an embodiment of this application.

To better understand this embodiment of this application, refer to FIG. 2. FIG. 2 is a schematic structural diagram of a to-be-measured semiconductor structure according to an embodiment of this application.

In FIG. 2, 201 represents various bottom-layer materials of the semiconductor structure, and 202 represents a periodic grating structure formed after the semiconductor structure is etched. Structure parameters corresponding to the periodic grating structure include a SWA, a HT, a CD, a duty cycle, and the like.

The duty cycle is a ratio of a line width to a pitch of the grating structure in the periodic grating structure. The line width may be determined by the CD of the periodic grating structure.

According to the method for measuring a semiconductor structure provided in this embodiment of this application, the OCD measurement areas are set in the scribe lines corresponding to the to-be-measured semiconductor structure and the reference semiconductor structure, and both the spectrum corresponding to the periodic grating structure in the to-be-measured semiconductor structure and the spectrum corresponding to the periodic grating structure in the reference semiconductor structure are measured. Therefore, in subsequent OCD measurement, the impact of the bottom-layer structure of the semiconductor structure on an OCD measurement result can be reduced.

Based on the content described in the foregoing embodiment, in some embodiments of this application, the structure parameters of the to-be-measured semiconductor structure include at least a sidewall angle, a height, a width, and a duty cycle that are corresponding to the periodic grating structure in the to-be-measured semiconductor structure.

Optionally, a second structure parameter of the to-be-measured semiconductor structure is at least one of the structure parameters of the to-be-measured semiconductor structure, and a first structure parameter of the to-be-measured semiconductor structure is at least one of structure parameters in the structure parameters of the to-be-measured semiconductor structure other than the second structure parameter.

For example, the second structure parameter of the to-be-measured semiconductor structure is the duty cycle in the structure parameters of the to-be-measured semiconductor structure, and the first structure parameter of the to-be-measured semiconductor structure is at least one of structure parameters in the structure parameters of the to-be-measured semiconductor structure other than the duty cycle.

The structure parameters of the reference semiconductor structure include at least a side wall angle, a height, a width, and a duty cycle that are corresponding to the periodic grating structure in the reference semiconductor structure.

Optionally, a second structure parameter of the reference semiconductor structure is at least one of the structure parameters of the reference semiconductor structure, and a first structure parameter of the reference semiconductor structure is at least one of structure parameters in the structure parameters of the reference semiconductor structure other than the second structure parameter.

For example, the second structure parameter of the reference semiconductor structure is the duty cycle in the structure parameters of the reference semiconductor structure, and the first structure parameter of the reference semiconductor structure is at least one of structure parameters in the structure parameters of the reference semiconductor structure other than the duty cycle.

Figure 3:
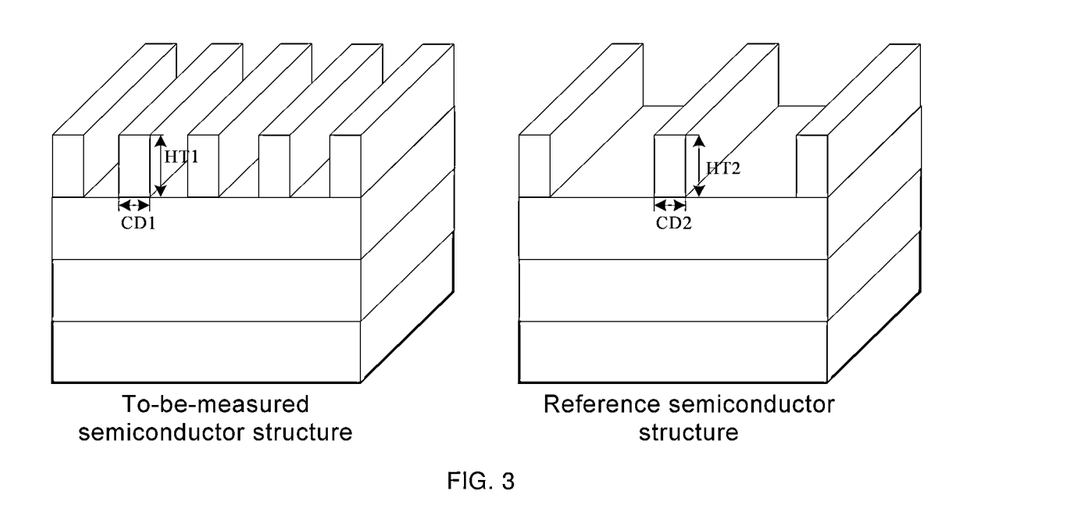
FIG. 3 is a schematic diagram of comparison between a to-be-measured semiconductor structure and a reference semiconductor structure according to an embodiment of this application.

To better understand this embodiment of this application, refer to FIG. 3. FIG. 3 is a schematic diagram of comparison between a to-be-measured semiconductor structure and a reference semiconductor structure according to an embodiment of this application.

In FIG. 3, assuming that a first structure parameter of the to-be-measured semiconductor structure includes a height HT1 and a width CD1, a first structure parameter of the reference semiconductor structure includes a height HT2 and a width CD2, a second structure parameter of the to-be-measured semiconductor structure is a duty cycle DK1, and a second structure parameter of the reference semiconductor structure is a duty cycle DK2. HT1=HT2, and DK1>DK2. However, due to the impact of a manufacturing process, after the duty cycle of the reference semiconductor structure is changed, CD2 is slightly less than CD1 due to side etching.

In this embodiment, after the structure parameters of the to-be-measured semiconductor structure and the reference semiconductor structure are determined, a first simulation model corresponding to the to-be-measured semiconductor structure and a second simulation model corresponding to the reference semiconductor structure may be established. Then, an OCD measurement technology is used to measure spectra corresponding to both the to-be-measured semiconductor structure and the reference semiconductor structure, and first structure parameters of the first simulation model and the second simulation model are adjusted. If the first structure parameters of the first simulation model and the second simulation model are adjusted to a same value at the same time, not only a first spectrum obtained by fitting based on the adjusted first simulation model successfully matches the spectrum corresponding to the to-be-measured semiconductor structure, but also a second spectrum obtained by fitting based on the adjusted second simulation model successfully matches the spectrum corresponding to the reference semiconductor structure. In this case, a parameter value of an adjusted structure parameter of the first simulation model may be determined as a parameter value of a structure parameter of the to-be-measured semiconductor structure.

In some embodiments, both a periodic grating structure in the to-be-measured semiconductor structure and a periodic grating structure in the reference semiconductor structure are made of highly transmissive materials, for example, materials such as oxide and silicon nitride.

It can be understood that, when periodic grating structures on top layers of the to-be-measured semiconductor structure and the reference semiconductor structure are made of highly transmissive materials, since bottom-layer structures of the to-be-measured semiconductor structure and the reference semiconductor structure are exactly the same, almost all differences in spectra are caused by the top layers when the rigorous coupled-wave theory is used to conduct spectral analysis. In this case, a strong correlation between structure parameters can be avoided by searching for a structure parameter that can satisfy both the first simulation model and the second simulation model, thereby avoiding an abnormal measurement result.

In a feasible implementation, a solving process based on the rigorous coupled-wave analysis theory includes:

Step 1. Divide the to-be-measured grating structure into layers with equal thicknesses or equal widths, conduct Fourier series expansion on an electromagnetic field at each layer, and derive expressions of electromagnetic fields at an incident medium layer and a basal layer according to a Maxwell's equation.

Step 2. Expand a dielectric constant of a grating layer by using Fourier series, derive a coupled-wave differential equation, and transform the coupled-wave differential equation into a problem of solving an intrinsic mode field.

Step 3. Solve an amplitude coefficient and a propagation constant of an intrinsic mode field at each layer through specific mathematical means by applying an electromagnetic field boundary condition on boundaries of different areas, to determine the grating diffraction efficiency or near-field distribution.

Figure 4:
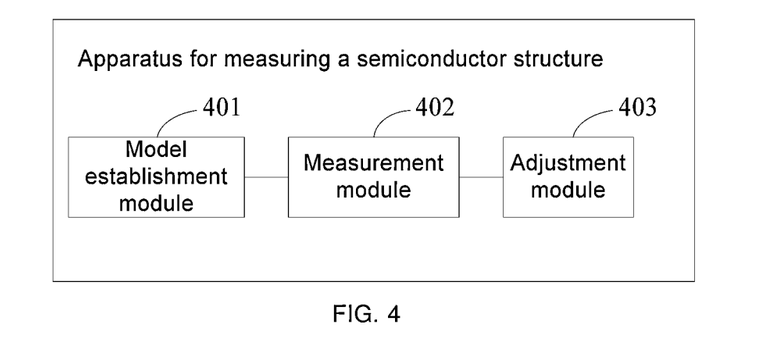
FIG. 4 is a schematic diagram of program modules of an apparatus for measuring a semiconductor structure according to an embodiment of this application.

Based on the content described in the foregoing embodiment, an embodiment of this application further provides an apparatus for measuring a semiconductor structure. Referring to FIG. 4, FIG. 4 is a schematic diagram of program modules of an apparatus for measuring a semiconductor structure according to an embodiment of this application. In a feasible implementation, the apparatus for measuring a semiconductor structure includes:

a model establishment module 401, configured to establish a first simulation model corresponding to a to-be-measured semiconductor structure and a second simulation model corresponding to a reference semiconductor structure, where at least one first structure parameter of the to-be-measured semiconductor structure has a same parameter value as a corresponding first structure parameter of the reference semiconductor structure, and at least one second structure parameter of the to-be-measured semiconductor structure has a parameter value different from that of a corresponding second structure parameter of the reference semiconductor structure;

a measurement module 402, configured to measure spectra of both the to-be-measured semiconductor structure and the reference semiconductor structure to obtain a first standard spectrum and a second standard spectrum; and an adjustment module 403, configured to: adjust first structure parameters and second structure parameters of the first simulation model and the second simulation model, and when each of the adjusted first structure parameters of the first simulation model and the second simulation model is the same, and a spectrum obtained by fitting based on the adjusted first simulation model and a spectrum obtained by fitting based on the adjusted second simulation model successfully match the first standard spectrum and the second standard spectrum, respectively, determine parameter value of each structure parameter of the adjusted first simulation model as parameter value of each structure parameter of the to-be-measured semiconductor structure.

It should be noted that, for specific implementation of the model establishment module 401, the measurement module 402, and the adjustment module 403 in this embodiment of this application, refer to the related content in the foregoing method embodiment. Details are not described herein.

According to the apparatus for measuring a semiconductor structure provided in this embodiment of this application, the reference semiconductor structure corresponding to the to-be-measured semiconductor structure is set. During measurement of the to-be-measured semiconductor structure, both the to-be-measured semiconductor structure and the reference semiconductor structure are simultaneously measured by using an OCD measurement technology, and same measured parameters obtained are used as the structure parameters of the to-be-measured semiconductor structure. In this way, an error of a measurement result of the to-be-measured semiconductor structure can be effectively reduced, and the measurement accuracy of the to-be-measured semiconductor structure can be improved.

In a feasible implementation, the to-be-measured semiconductor structure and the reference semiconductor structure each include a periodic grating structure, and the measurement module 402 is configured to:

measure the periodic grating structure in the to-be-measured semiconductor structure to obtain the first standard spectrum, and measure the periodic grating structure in the reference semiconductor structure to obtain the second standard spectrum.

In a feasible implementation, both the periodic grating structure in the to-be-measured semiconductor structure and the periodic grating structure in the reference semiconductor structure are made of highly transmissive materials.

In a feasible implementation, the structure parameters of the to-be-measured semiconductor structure include at least a SWA, a HT, a width, and a duty cycle that are corresponding to the periodic grating structure in the to-be-measured semiconductor structure; and the structure parameters of the reference semiconductor structure include at least a SWA, a HT, a width, and a duty cycle that are corresponding to the periodic grating structure in the reference semiconductor structure.

In a feasible implementation, the adjustment module 403 is configured to:

simultaneously adjust the first structure parameters and the second structure parameters of the first simulation model and the second simulation model, match a first spectrum obtained by fitting based on the adjusted first simulation model with the first standard spectrum, and match a second spectrum obtained by fitting based on the adjusted second simulation model with the second standard spectrum.

In a feasible implementation, the adjustment module 403 is configured to:

divide the first structure parameters and the second structure parameters of each of the first simulation model and the second simulation model into multiple groups; and successively adjust, based on the groups obtained through division, structure parameters in each group of the first simulation model and the second simulation model, match a first spectrum obtained by fitting based on the adjusted first simulation model with the first standard spectrum, and match a second spectrum obtained by fitting based on the adjusted second simulation model with the second standard spectrum.

In a feasible implementation, the adjustment module 403 is configured to:

based on the rigorous coupled-wave analysis theory, match the first spectrum obtained by fitting based on the adjusted first simulation model with the first standard spectrum, and match the second spectrum obtained by fitting based on the adjusted second simulation model with the second standard spectrum.

It can be understood that functions implemented by the function modules in the apparatus for measuring a semiconductor structure are corresponding to the steps in the method for measuring a semiconductor structure described in the foregoing embodiment. Therefore, for a detailed implementation process of the function modules of the apparatus for measuring a semiconductor structure, refer to the steps in the method for measuring a semiconductor structure described in the foregoing embodiment. Details are not described herein again.

Further, based on the content described in the foregoing embodiment, an embodiment of this application further provides an electronic device. The electronic device includes at least one processor and a memory. The memory stores computer-executable instructions. The at least one processor executes the computer-executable instructions stored in the memory to implement the steps in the method for measuring a semiconductor structure described in the foregoing embodiment. Details are not described in this embodiment again.

Further, based on the content described in the foregoing embodiment, an embodiment of this application further provides a computer-readable storage medium. The computer-readable storage medium stores computer-executable instructions. When a processor executes the computer-executable instructions, the steps in the method for measuring a semiconductor structure described in the foregoing embodiment are implemented.

In several embodiments provided in this application, it should be understood that the disclosed device and method may be implemented in other manners. For example, the described device embodiment is merely an example. For example, the module division is merely a logical function division, and there may be other division manners in actual implementation. For example, a plurality of modules may be combined or integrated into another system, or some features may be ignored or may not be performed. In addition, the displayed or discussed mutual couplings or direct couplings or communication connections may be implemented by using some interfaces. The indirect couplings or communication connections between the apparatuses or modules may be implemented in electrical, mechanical, or other forms.

The modules described as separate parts may or may not be physically separate, and parts displayed as modules may or may not be physical units, may be located in one position, or may be distributed on a plurality of network units. Some or all of the modules may be selected based on actual requirements to achieve the objectives of the solutions of the embodiments.

In addition, function modules in the embodiments of this application may be integrated into one processing unit, or each of the modules may exist alone physically, or two or more modules are integrated into one unit. The unit into which the modules are integrated unit may be implemented in a form of hardware, or may be implemented in a form of hardware plus software functional units.

The integrated module implemented in a form of a software functional module may be stored in a computer-readable storage medium. The software functional module is stored in a storage medium and includes multiple instructions to cause a computer device (which may be a personal computer, a server, a network device, or the like) or a processor to perform some of the steps of the methods described in the embodiments of this application.

It should be understood that, the processor may be a central processing unit (CPU), or may be another general-purpose processor, a digital signal processor (DSP), an application-specific integrated circuit (ASIC), or the like. The general-purpose processor may be a microprocessor, or the processor may be any conventional processor or the like. The steps of the method disclosed by the embodiments of this application may be directly performed by a hardware processor or by a combination of hardware and software modules in a processor.

The memory may include a high-speed RAM memory, may further include a non-volatile memory NVM, for example, at least one magnetic disk memory, or may be a USB flash drive, a removable hard disk, a read-only memory, a magnetic disk, an optical disc, or the like.

The bus may be an industry standard architecture (ISA) bus, a peripheral component interconnect (PCI) bus, an extended industry standard architecture (EISA) bus, or the like. The bus may be classified into an address bus, a data bus, a control bus, and the like. For ease of denotation, for the bus in the drawings of this application, it is not required that there is only one bus or only one type of bus.

The storage medium may be implemented by any type of volatile or non-volatile storage device or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk, or an optical disc. The storage medium may be any available medium that can be accessed by a general-purpose or special-purpose computer.

For example, a storage medium is coupled to a processor, so that the processor can read information from the storage medium or write information into the storage medium. Certainly, the storage medium may alternatively be a component of the processor. The processor and the storage medium may be located in an application-specific integrated circuit (ASIC). Certainly, the processor and the storage medium may alternatively exist as discrete components in an electronic device or a main control device.

Persons of ordinary skill in the art may understand that all or some of the steps of the method embodiments may be implemented by a program instructing relevant hardware. The program may be stored in a computer-readable storage medium. When the program runs, the steps of the method embodiments are performed. The foregoing storage medium includes any medium that can store program code, such as a ROM, a RAM, a magnetic disk, or an optical disc.

Finally, it should be noted that the above embodiments are merely used to explain the technical solutions of this application, but are not intended to limit this application. Although this application is described in detail with reference to the foregoing embodiments, persons of ordinary skill in the art should understand that they can still modify the technical solutions described in the foregoing embodiments, or make equivalent replacements on some or all technical features therein. These modifications or replacements do not make the essence of the corresponding technical solutions deviate from the scope of the technical solutions of the embodiments of this application.

The invention claimed is:

1. A method for measuring a semiconductor structure, comprising:
    establishing a first simulation model corresponding to a to-be-measured semiconductor structure and a second simulation model corresponding to a reference semiconductor structure, wherein at least one first structure parameter of the to-be-measured semiconductor structure has a same parameter value as a corresponding first structure parameter of the reference semiconductor structure, and at least one second structure parameter of the to-be-measured semiconductor structure has a parameter value different from a parameter value of a corresponding second structure parameter of the reference semiconductor structure;
    measuring spectra of both the to-be-measured semiconductor structure and the reference semiconductor structure to obtain a first standard spectrum and a second standard spectrum, respectively, wherein both the first simulation model and the second simulation model include first structure parameters and second structure parameters; and adjusting first structure parameters and second structure parameters of the first simulation model and the second simulation model, and when each of the adjusted first structure parameters of the first simulation model and the second simulation model is the same, and a spectrum obtained by fitting based on the adjusted first simulation model and a spectrum obtained by fitting based on the adjusted second simulation model successfully match the first standard spectrum and the second standard spectrum, respectively, determining parameter value of each structure parameter of the adjusted first simulation model as parameter value of each structure parameter of the to-be-measured semiconductor structure;

wherein the adjusting first structure parameters and second structure parameters of the first simulation model and the second simulation model comprises:

simultaneously adjusting the first structure parameters and the second structure parameters of the first simulation model and the second simulation model, matching a first spectrum obtained by fitting based on the adjusted first simulation model with the first standard spectrum, and matching a second spectrum obtained by fitting based on the adjusted second simulation model with the second standard spectrum.

2. The method according to claim 1, wherein the to-be-measured semiconductor structure and the reference semiconductor structure each comprise a periodic grating structure, and the measuring spectra of both the to-be-measured semiconductor structure and the reference semiconductor structure comprises:

measuring the periodic grating structure in the to-be-measured semiconductor structure to obtain the first standard spectrum, and measuring the periodic grating structure in the reference semiconductor structure to obtain the second standard spectrum.

3. The method according to claim 2, wherein both the periodic grating structure in the to-be-measured semiconductor structure and the periodic grating structure in the reference semiconductor structure are made of highly transmissive materials.

4. The method according to claim 2, wherein the first structure parameter and the second structure parameter of the to-be-measured semiconductor structure comprise at least a side wall angle, a height, a width, and a duty cycle that are corresponding to the periodic grating structure in the to-be-measured semiconductor structure; and the first structure parameter and the second structure parameter of the reference semiconductor structure comprise at least a side wall angle, a height, a width, and a duty cycle that are corresponding to the periodic grating structure in the reference semiconductor structure.

5. The method according to claim 4, wherein the adjusting first structure parameters and second structure parameters of the first simulation model and the second simulation model comprises:

dividing the first structure parameters and the second structure parameters of each of the first simulation model and the second simulation model into multiple groups; and successively adjusting, based on the groups obtained through division, structure parameters in each group of the first simulation model and the second simulation model, matching a first spectrum obtained by fitting based on the adjusted first simulation model with the first standard spectrum, and matching a second spectrum obtained by fitting based on the adjusted second simulation model with the second standard spectrum.

6. The method according to claim 5, wherein the matching a first spectrum obtained by fitting based on the adjusted first simulation model with the first standard spectrum, and matching a second spectrum obtained by fitting based on the adjusted second simulation model with the second standard spectrum comprises:

based on a rigorous coupled-wave analysis theory, matching the first spectrum obtained by fitting based on the adjusted first simulation model with the first standard spectrum, and matching the second spectrum obtained by fitting based on the adjusted second simulation model with the second standard spectrum.

7. The method according to claim 1, wherein the matching a first spectrum obtained by fitting based on the adjusted first simulation model with the first standard spectrum, and matching a second spectrum obtained by fitting based on the adjusted second simulation model with the second standard spectrum comprises:

based on a rigorous coupled-wave analysis theory, matching the first spectrum obtained by fitting based on the adjusted first simulation model with the first standard spectrum, and matching the second spectrum obtained by fitting based on the adjusted second simulation model with the second standard spectrum.

8. An apparatus for measuring a semiconductor structure, comprising:

a model establishment module, configured to establish a first simulation model corresponding to a to-be-measured semiconductor structure and a second simulation model corresponding to a reference semiconductor structure, wherein at least one first structure parameter of the to-be-measured semiconductor structure has a same parameter value as a corresponding first structure parameter of the reference semiconductor structure, and at least one second structure parameter of the to-be-measured semiconductor structure has a parameter value different from a parameter value of a corresponding second structure parameter of the reference semiconductor structure;

a measurement module, configured to measure spectra of both the to-be-measured semiconductor structure and the reference semiconductor structure to obtain a first standard spectrum and a second standard spectrum, respectively, wherein both the first simulation model and the second simulation model include first structure parameters and second structure parameters; and an adjustment module, configured to adjust first structure parameters and second structure parameters of the first simulation model and the second simulation model, and when each of the adjusted first structure parameters of the first simulation model and the second simulation model is the same, and a spectrum obtained by fitting based on the adjusted first simulation model and a spectrum obtained by fitting based on the adjusted second simulation model successfully match the first standard spectrum and the second standard spectrum, respectively, determine parameter value of each structure parameter of the adjusted first simulation model as parameter value of each structure parameter of the to-be-measured semiconductor structure;

wherein the adjustment module is further configured to:

simultaneously adjust the first structure parameters and the second structure parameters of the first simulation model and the second simulation model, match a first spectrum obtained by fitting based on the adjusted first simulation model with the first standard spectrum, and match a second spectrum obtained by fitting based on the adjusted second simulation model with the second standard spectrum.

9. The apparatus according to claim 8, wherein the to-be-measured semiconductor structure and the reference semiconductor structure each comprise a periodic grating structure, and the measurement module is configured to:
   measure the periodic grating structure in the to-be-measured semiconductor structure to obtain the first standard spectrum, and measure the periodic grating structure in the reference semiconductor structure to obtain the second standard spectrum.

10. The apparatus according to claim 9, wherein both the periodic grating structure in the to-be-measured semiconductor structure and the periodic grating structure in the reference semiconductor structure are made of highly transmissive materials.

11. The apparatus according to claim 9, wherein the first structure parameter and the second structure parameter of the to-be-measured semiconductor structure comprise at least a side wall angle, a height, a width, and a duty cycle that are corresponding to the periodic grating structure in the to-be-measured semiconductor structure; and
   the first structure parameter and the second structure parameter of the reference semiconductor structure comprise at least a side wall angle, a height, a width, and a duty cycle that are corresponding to the periodic grating structure in the reference semiconductor structure.

12. The apparatus according to claim 11, wherein the adjustment module is configured to:
   divide the first structure parameters and the second structure parameters of each of the first simulation model and the second simulation model into multiple groups; and
   successively adjust, based on the groups obtained through division, structure parameters in each group of the first simulation model and the second simulation model, match a first spectrum obtained by fitting based on the adjusted first simulation model with the first standard spectrum, and match a second spectrum obtained by fitting based on the adjusted second simulation model with the second standard spectrum.

13. The apparatus according to claim 12, wherein the adjustment module is configured to:
   based on a rigorous coupled-wave analysis theory, match the first spectrum obtained by fitting based on the adjusted first simulation model with the first standard spectrum, and match the second spectrum obtained by fitting based on the adjusted second simulation model with the second standard spectrum.

14. The apparatus according to claim 8, wherein the adjustment module is further configured to:
   based on a rigorous coupled-wave analysis theory, match the first spectrum obtained by fitting based on the adjusted first simulation model with the first standard spectrum, and match the second spectrum obtained by fitting based on the adjusted second simulation model with the second standard spectrum.

15. An electronic device, comprising: at least one processor and a memory; wherein
   the memory stores computer-executable instructions; and
   the at least one processor executes the computer-executable instructions stored in the memory, so that the at least one processor implements a method for measuring a semiconductor structure comprising:
   establishing a first simulation model corresponding to a to-be-measured semiconductor structure and a second simulation model corresponding to a reference semiconductor structure, wherein at least one first structure parameter of the to-be-measured semiconductor structure has a same parameter value as a corresponding first structure parameter of the reference semiconductor structure, and at least one second structure parameter of the to-be-measured semiconductor structure has a parameter value different from a parameter value of a corresponding second structure parameter of the reference semiconductor structure;
   measuring spectra of both the to-be-measured semiconductor structure and the reference semiconductor structure to obtain a first standard spectrum and a second standard spectrum, respectively, wherein both the first simulation model and the second simulation model include first structure parameters and second structure parameters; and
   adjusting first structure parameters and second structure parameters of the first simulation model and the second simulation model, and when each of the adjusted first structure parameters of the first simulation model and the second simulation model is the same, and a spectrum obtained by fitting based on the adjusted first simulation model and a spectrum obtained by fitting based on the adjusted second simulation model successfully match the first standard spectrum and the second standard spectrum, respectively, determining parameter value of each structure parameter of the adjusted first simulation model as parameter value of each structure parameter of the to-be-measured semiconductor structure;
   wherein the adjusting first structure parameters and second structure parameters of the first simulation model and the second simulation model comprises:
   simultaneously adjusting the first structure parameters and the second structure parameters of the first simulation model and the second simulation model, matching a first spectrum obtained by fitting based on the adjusted first simulation model with the first standard spectrum, and matching a second spectrum obtained by fitting based on the adjusted second simulation model with the second standard spectrum.

16. A non-transitory computer-readable storage medium, the computer-readable storage medium stores instructions, and when the instructions are run on a computer, the computer is enabled to implement the method for measuring the semiconductor structure according to claim 1.

* * * * *